(12) United States Patent
Gagne

(10) Patent No.: US 8,143,749 B2
(45) Date of Patent: Mar. 27, 2012

(54) DUAL CURRENT SWITCH DETECTION CIRCUIT WITH SELECTIVE ACTIVATION

(75) Inventor: Justin Joseph Rosen Gagne, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 591 days.

(21) Appl. No.: 12/266,008

(22) Filed: Nov. 6, 2008

(65) Prior Publication Data
US 2010/0109441 A1 May 6, 2010

(51) Int. Cl.
*H02H 3/00* (2006.01)
*H01H 35/00* (2006.01)
(52) U.S. Cl. ....................................... 307/130
(58) Field of Classification Search ................ 307/130
See application file for complete search history.

(56) References Cited

U.S. PATENT DOCUMENTS

| | | | |
|---|---|---|---|
| 6,351,182 B1 * | 2/2002 | Drapkin et al. .............. | 327/543 |
| 6,434,404 B1 | 8/2002 | Claxton | |
| 2006/0045214 A1 | 3/2006 | Shiina | |
| 2006/0061403 A1 | 3/2006 | Kawasaki et al. | |
| 2007/0060061 A1 | 3/2007 | Sampath | |
| 2007/0195738 A1 | 8/2007 | Kim | |
| 2008/0106305 A1 | 5/2008 | Kimura | |
| 2008/0225010 A1 * | 9/2008 | Wang ............................ | 345/173 |

FOREIGN PATENT DOCUMENTS

| | | |
|---|---|---|
| WO | 9728550 | 8/1997 |
| WO | 9832226 | 7/1998 |

OTHER PUBLICATIONS

International Search Report and Written Opinion—PCT/US2009/038211, International Search Authority—European Patent Office—Mar. 25, 2009.
International Search Report—PCT/US2009/063525, International Search Authority—European Patent Office Jan. 29, 2010.
Written Opinion—PCT/ US2009/063525, International Search Authority—European Patent Office Jan. 29, 2010.

* cited by examiner

*Primary Examiner* — Jared Fureman
*Assistant Examiner* — Dru Parries
(74) *Attorney, Agent, or Firm* — Sam Talpalatsky; Nicholas J. Pauley; Jonathan T. Velasco

(57) ABSTRACT

A dual current switch detection circuit with selective activation is disclosed. In a particular embodiment, the switch detection circuit comprises an input node coupled to a switch to receive an input signal from the switch, a first current source coupled to the input node, a second current source coupled to the input node, and a detection circuit having an input coupled to the input node and an output coupled to the second current source to selectively activate the second current source.

25 Claims, 7 Drawing Sheets

DUAL CURRENT SWITCH DETECTION CIRCUIT WITH SELECTIVE ACTIVATION

FIELD

The present disclosure relates generally to switch detection circuits.

DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The foregoing portable computing devices are generally battery powered. The trend toward smaller and more advanced portable computing devices has produced an ever-greater demand on the battery. Solutions, among other things, have involved providing low power modes in the computing devices to conserve the battery when the computing devices are not actively used. Most of the portable computing devices include at least one switch that generates a signal (e.g., via grounding) to designate a particular function, such as a signal for exiting a low power mode when a clamshell or a slide of the wireless telephone is opened. Typically, the switch (or a switch detection circuit coupled to the switch) includes a pull-up resistor of about 50 k ohms to about 100 k ohms that provides a reference voltage and current from the switch. Such resistors increase the drain on the battery, decrease voltage rise time, are susceptible to noise and may produce noise when grounded without parasitic or discrete capacitance.

SUMMARY

In a particular embodiment, a switch detection circuit is disclosed. The switch detection circuit includes an input node to receive an input signal from a switch, a first current source coupled to the input node, a second current source coupled to the input node, and a detection circuit having an input coupled to the input node and an output coupled to the second current source to selectively activate the second current source.

In another particular embodiment, an electronic device is disclosed. The electronic device includes a switch and a switch detection circuit. The switch detection circuit includes an input node coupled to the switch, a first current source coupled to the input node, a second current source coupled to the input node, and a detection circuit having an input coupled to the input node and an output coupled to the second current source to selectively activate the second current source.

In another particular embodiment, a method of operating a switch detection circuit is disclosed. The method includes providing a first current via a first current source, the first current to increase a voltage at an input node of a switch detection circuit after an opening event of the input signal, detecting when the voltage is greater than a control threshold voltage, selectively activating a second current source to generate a second current when the voltage exceeds the control threshold voltage, and generating an output signal when the voltage at the input node is greater than an output high threshold voltage. The second current is greater than the first current to increase the voltage at the input node.

In yet another particular embodiment, a switch detection circuit is disclosed. The switch detection circuit includes an input node to receive an input signal from a switch, a dual mode current source coupled to the input node, the dual mode current source including a low current mode and a high current mode, and a detection circuit having an input coupled to the input node, the detection circuit providing an output coupled to the dual mode current source to selectively activate at least the high current mode.

In still another particular embodiment, an electronic device is disclosed. The electronic device includes a switch detection circuit. The switch detection circuit includes an input node coupled to a switch, a dual mode current source coupled to the input node, the dual mode current source including a low current mode and a high current mode, and a detection circuit having an input coupled to the input node, the detection circuit providing an output coupled to the dual mode current source to selectively activate at least the high current mode.

Particular advantages provided by the one or more of the embodiments of the dual current source switch detection circuit with selective activation are improved voltage rise time and decreased battery drain over conventional resistor-based switches or switch detection circuits. Decreasing battery drain lowers current consumption during a low power mode and improves the overall operating time of the electronic device.

Other aspects, advantages, and features of the present disclosure will become apparent after review of the entire application, including the following sections: Brief Description of the Drawings, Detailed Description, and the Claims.

DETAILED DESCRIPTION

Figure 1:
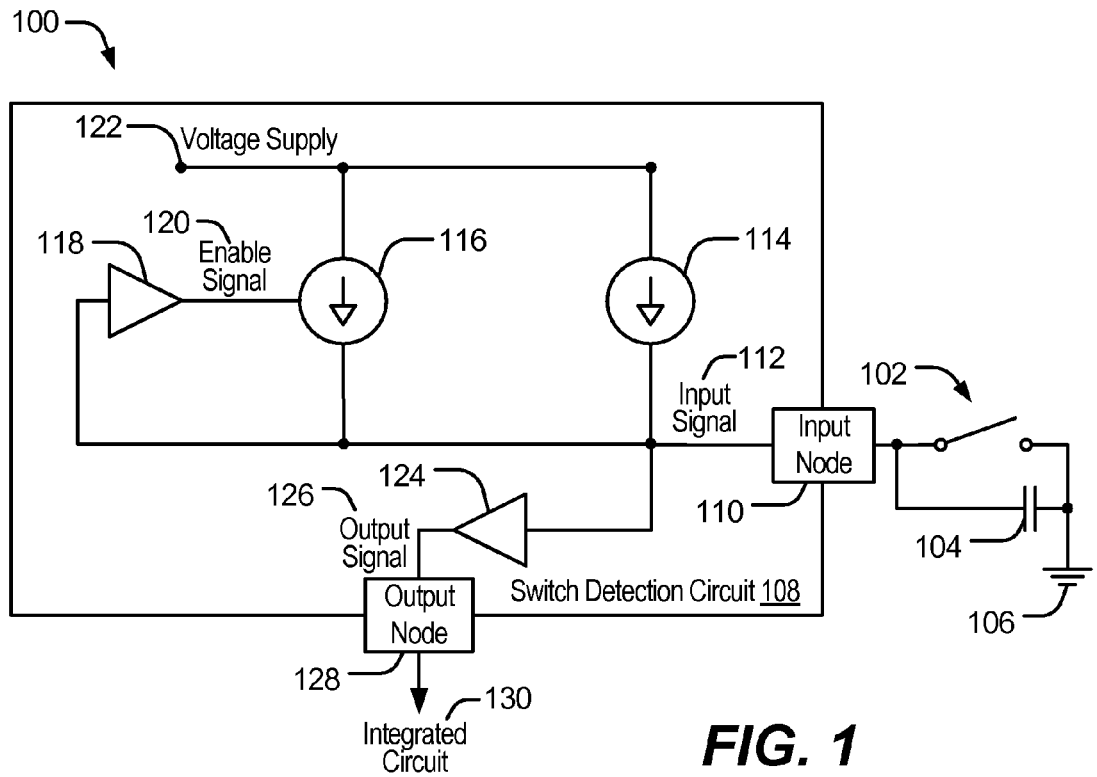
FIG. 1 is circuit diagram of a particular illustrative embodiment of a dual current source pull-up switch detection circuit coupled to an external switch.

Referring to FIG. 1, a circuit diagram of a particular illustrative embodiment of a dual current source pull-up switch detection circuit 108 coupled to an external switch 102 is disclosed and generally designated 100. The external switch 102 includes a capacitor 104 to mitigate the external switch 102 from turning on/off multiple times before the contacts of the external switch 102 achieve a good connection. The capacitor 104 may be from about 1 picofarad (pF) to about 15 pF. The capacitor 104 may consist of 1-5 pF of parasitic capacitance or 1-15 pF of discrete capacitance. The external switch 102 is coupled to a ground 106 to provide a grounded signal to the switch detection circuit 108. The external switch 102 may be a mechanical switch (e.g., a carbon switch, a metal contact switch, and similar devices), an electrical switch (e.g., a field effect transistor, bipolar transistor, and similar devices), as well as any other conventional switch or a switch yet to be developed that can provide a signal to the switch detection circuit 108. The external switch 102 may be activated with the removal or insertion of a multimedia card into a multimedia interface (e.g., via a socket switch), removal or insertion of a subscriber identity module (SIM) card into a SIM interface, opening or closing of a clam shell or slide of a wireless telephone, user input via a cellular telephone (e.g., key press or toggle of a button), detection of a hold function for a media player, and the like. The recited list of functions is non-exhaustive and the external switch 102 may be activated for other functions of a portable computing device that employ switches.

Further with reference to FIG. 1, the switch detection circuit 108 includes an input node 110 that is coupled to the external switch 102. The input node 110 receives an input signal 112 upon activation of the external switch 102 (e.g., via the closing and the opening of the external switch 102). The switch detection circuit 108 further includes a first current source 114 that provides a first current and a second current source 116 that provides a second current. The first current source 114 and the second current source 116 may be pull-up transistors, such as a p-channel field effect transistor (PFET), a PNP bipolar transistor, a p-channel junction FET (JFET) transistor, as illustrative examples. The second current source 116 may be configured to provide a substantially larger current than the first current source 114 and controlled by a detection circuit 118 responsive to the input node 110. In this way, when the external switch 102 is shorted (e.g., closed), the smaller first current source 114 continues to provide current after the larger second current source 116 is overpowered (e.g., via grounding) and turned off by the detection circuit 118. This provides for decreased battery drain because the second current source 116 is turned off and only the substantially smaller first current source 114 provides current. When the switch 102 is released (e.g., opened), the smaller first current source 114 continues to provide current as the larger second current source 116 is then selectively turned on. This also provides for decreased battery drain because the second current source 116 is selectively turned on.

Yet further with reference to FIG. 1, the first current source 114 and the second current source 116 are coupled between a voltage supply 122 and the input node 110. The voltage source 122 provides a voltage (e.g., 1.8V). The voltage may be higher or lower depending on particular circuit requirements. The control of the first current source 114 is always asserted. The second current source 116 is coupled to the detection circuit 118 that may provide an enable signal 120 to selectively activate the second current source 116. The detection circuit 118 is also coupled to the input node 110. The detection circuit 118 is a circuit element or a combination of circuit elements that can selectively activate the second current source 116. The detection circuit 118 may be a buffer, an inverter, a combination of a comparator and a logic gate, or any other circuit element or combination of circuit elements that can selectively activate the second current source 116. An output buffer 124 is coupled to the input node 110. The output buffer 124 provides an output signal 126 to an output node 128 of the switch detection circuit 108. The output node 128 may be coupled to an input of an integrated circuit 130, such as a processor or a power management circuit.

Figure 2:
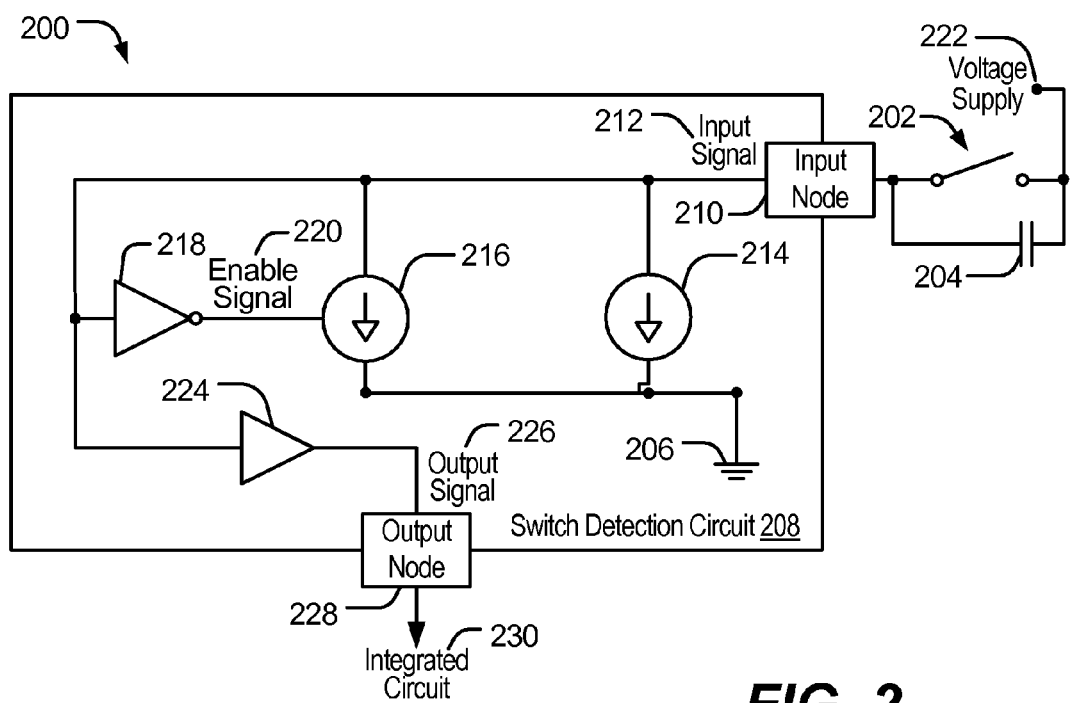
FIG. 2 is circuit diagram of a particular illustrative embodiment of a dual current source pull-down switch detection circuit coupled to an external switch.

Referring to FIG. 2, a circuit diagram of a particular illustrative embodiment of a dual current source pull-down switch detection circuit 208 coupled to an external switch 202 is disclosed and generally designated 200. The external switch 202 includes a capacitor 204 to mitigate the external switch 202 from turning on/off multiple times before the contacts of the external switch 202 achieve a good connection. The capacitor 204 may be from about 1 pF to about 15 pF. The capacitor 204 may consist of 1-5 pF of parasitic capacitance or 1-15 pF of discrete capacitance. The external switch 202 is coupled to a voltage supply 222 to provide a positive reference voltage signal to the switch detection circuit 208. The external switch 202 may be a mechanical switch (e.g., a carbon switch, a metal contact switch, and similar devices), an electrical switch (e.g., a field effect transistor switch, bipolar transistor, and similar devices), as well as any other conventional switch or a switch yet to be developed that can provide a signal to the switch detection circuit 208. The external switch 202 may be activated with the removal or insertion of a multimedia card into a multimedia interface (e.g., via a socket switch), removal or insertion of a subscriber identity module (SIM) card into a SIM interface, opening or closing of a clam shell or slide of a wireless telephone, user input via a cellular telephone (e.g., key press or toggle of a button), detection of a hold function for a media player, and the like. The recited list of functions is non-exhaustive and the external switch 202 may be activated for other functions of a portable computing device that employ switches.

Further with reference to FIG. 2, the switch detection circuit 208 includes an input node 210 that is coupled to the external switch 202. The input node 210 receives an input signal 212 upon activation of the external switch 202 (e.g., via the closing and the opening of the external switch 202). The switch detection circuit 208 further includes a first current source 214 that provides a first current and a second current source 216 that provides a second current. The first current source 214 and the second current source 216 may be pull-down transistors, such as a re-channel field effect transistor (NFET), a NPN bipolar transistor, a n-channel junction FET (JFET) transistor, as illustrative examples. The second current source 216 may be configured to provide a substantially larger current than the first current source 214 and controlled by a detection circuit 218 responsive to the input node 210. In this way, when the external switch 202 is shorted (e.g., closed), the smaller first current source 214 may continue to provide current after the larger second current source 216 is overpowered (e.g., via positive reference voltage of supply voltage 222) and turned off by the detection circuit 218. This provides for decreased battery drain because the second current source 216 is turned off and only the substantially smaller first current source 214 remains turned on. When the switch 202 is released (e.g., opened), the smaller first current source 214 continues to provide current as the larger second current source 216 is selectively then turned on. This also provides for decreased battery drain because the second current source 216 is selectively turned on.

Yet further with reference to FIG. 2, the first current source 214 and the second current source 216 are coupled between a ground 206 and the input node 210. The voltage source 222 provides a voltage (e.g., 1.8V). The voltage may be higher or lower depending on particular circuit requirements. The control of the first current source 214 is always asserted. The second current source 216 is coupled to the detection circuit 218 that may provide an enable signal 220 to selectively activate the second current source 216. The detection circuit 218 is also coupled to the input node 210. The detection circuit 218 is a circuit element or a combination of circuit elements that can selectively activate the second current source 216. The detection circuit 218 may be a buffer, an inverter, a combination of a comparator and a logic gate, or any other circuit element or combination of circuit elements that can selectively activate the second current source 216. An output buffer 224 is coupled to the input node 210. The output buffer 224 provides an output signal 226 to an output node 228 of the switch detection circuit 208. The output node 228 may be coupled to an input of an integrated circuit 230, such as a processor or a power management circuit.

Figure 3:
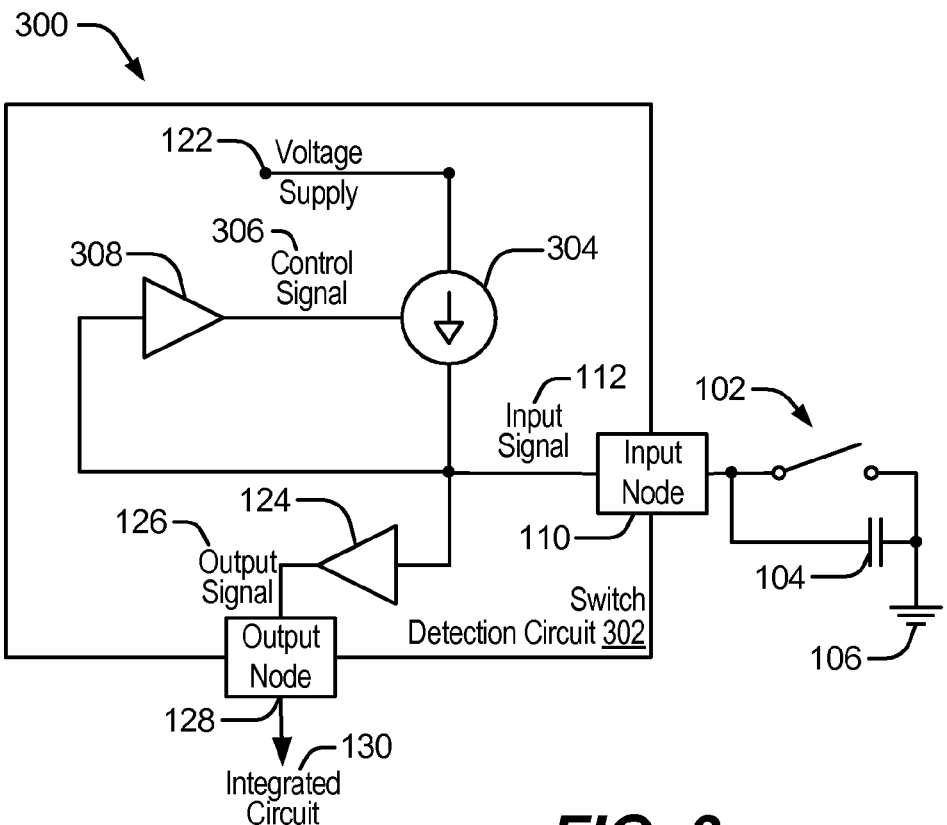
FIG. 3 is circuit diagram of particular illustrative embodiment of a dual mode current source pull-up switch detection circuit coupled to an external switch.

Referring to FIG. 3, a circuit diagram of a particular illustrative embodiment of a dual mode current source pull-up switch detection circuit 302 coupled to an external switch 102 is disclosed and generally designated 300. The dual mode current source pull-up switch detection circuit 302 of FIG. 3 operates in similar fashion to the dual current source pull-up switch detection circuit 108 of FIG. 1. However, instead of the dual current sources 114 and 116 depicted in FIG. 1, the dual mode current source pull-up switch detection circuit 302 includes a dual mode current source 304. The dual mode current source 304 includes a low current mode and a high current mode. The dual mode current source 304 may be a pull-up transistor, such as a p-channel field effect transistor (PFET), a PNP bipolar transistor, or a p-channel junction FET (JFET) transistor, as illustrative examples. The dual mode current source 304 is responsive to the detection circuit 308 that may provide different voltage control levels via a control signal 306 to selectively activate at least the high current mode of the dual mode current source 304. The dual mode current source 304 may be configured to provide a substantially larger current via the high current mode than via the low current mode, as controlled by a lower control voltage level via the control signal 306 from the detection circuit 308 that is responsive to the input node 110. In this way, when the external switch 102 is shorted (e.g., closed), the dual mode current source 304 selectively enters the low current mode to provide a low current in response to the control signal 306. The low current mode enables decreased battery drain because the high current mode of the dual mode current source 304 is turned off and only the low current mode provides a substantially smaller current. When the switch 102 is released (e.g., opened), the dual mode current source 304 enters the high current mode to provide a high current in response to the control signal 306 from the detection circuit 308. The high current mode enables a larger current than the lower current mode to decrease a response time at the output node 128. In a particular embodiment, the control signal 306 includes a first voltage applied to a gate of a transistor in the dual mode current source 304 to enable a current about 2 µA in the low current mode, and a second voltage applied to the gate of the transistor to enable a current of about 32 µA in the high current mode.

Figure 4:
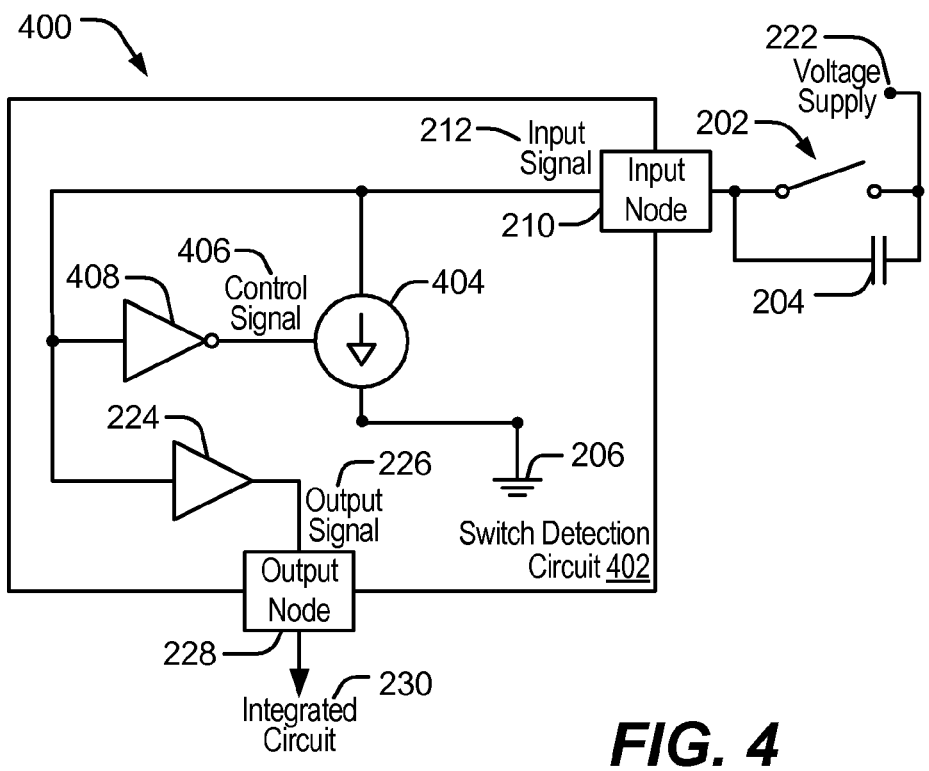
FIG. 4 is circuit diagram of a particular illustrative embodiment of a dual mode current source pull-down switch detection circuit coupled to an external switch.

Referring to FIG. 4, a circuit diagram of a particular illustrative embodiment of a dual mode current source pull-down switch detection circuit 402 coupled to an external switch 202 is disclosed and generally designated 400. The dual mode current source pull-down switch detection circuit 402 of FIG. 4 operates in similar fashion to the dual current source pull-down switch detection circuit 208 of FIG. 2. However, instead of the dual current sources 214 and 216 depicted in FIG. 2, the dual mode current source pull-down switch detection circuit 402 includes a dual mode current source 404. The dual mode current source 404 includes a low current mode and a high current mode. The dual mode current source 404 may be a pull-down transistor, such as an n-channel field effect transistor (NFET), a NPN bipolar transistor, or a n-channel junction FET (JFET) transistor, as illustrative examples. The dual mode current source 404 is responsive to the detection circuit 408 that may provide different control voltage levels via a control signal 406 to selectively activate at least the high current mode of the dual mode current source 404. The dual mode current source 404 may be configured to provide a substantially larger current via the high current mode than via the low current mode, as controlled by a lower control voltage level via the control signal 406 from the detection circuit 408 that is responsive to the input node 210. In this way, when the external switch 202 is shorted (e.g., closed), the dual mode current source 404 selectively enters the low current mode to provide a low current in response to the control signal 406. The low current mode enables decreased battery drain because the high current mode of the dual mode current source 404 is turned off and only the low current mode provides a substantially smaller current. When the switch 202 is released (e.g., opened), the dual mode current source 404 enters the high current mode to provide a high current in response to the control signal 406 from the detection circuit 408. The high current mode enables a larger current than the low current mode to decrease a response time at the output node 228. In a particular embodiment, the control signal 406 includes a first voltage applied to a gate of a transistor in the dual mode current source 404 to enable a current about 2 µA in the low current mode, and a second voltage applied to the gate of the transistor to enable a current of about 32 µA in the high current mode.

Figure 5:
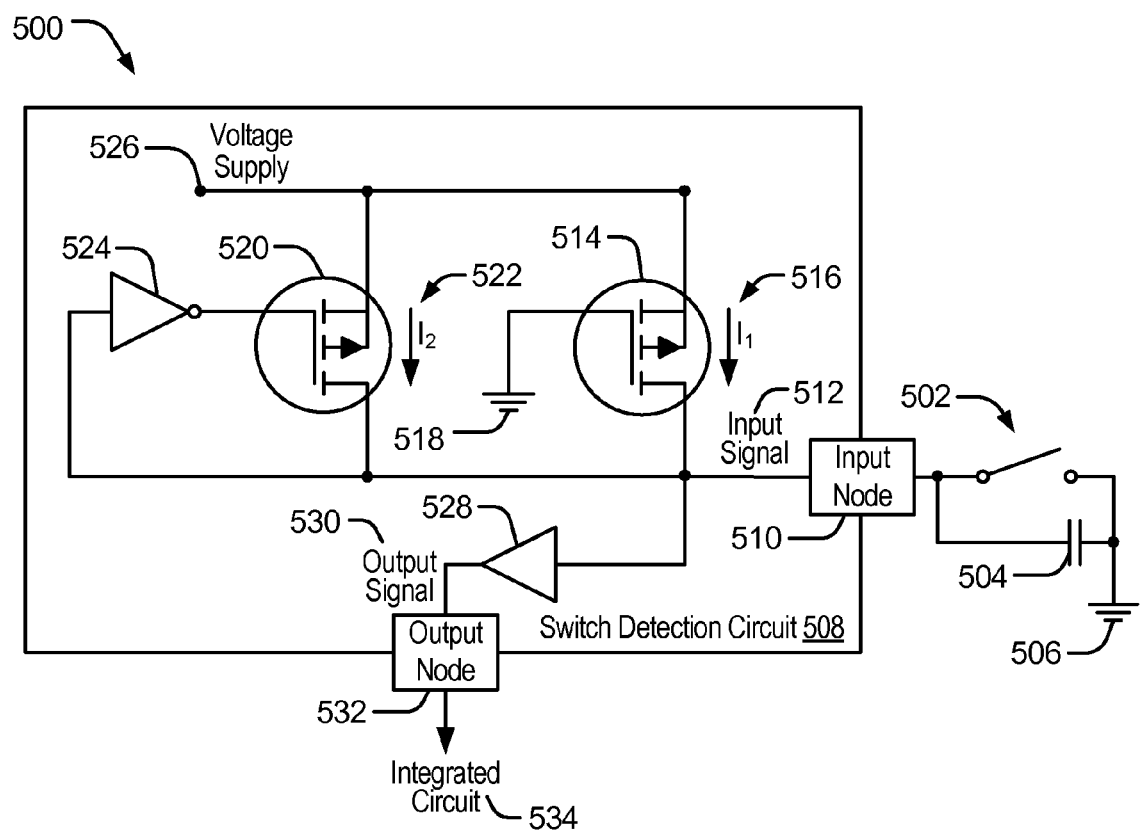
FIG. 5 is circuit diagram of another illustrative embodiment of a dual current source pull-up switch detection circuit coupled to an external switch, the switch detection circuit using p-channel field effect transistors (PFETs)

Referring to FIG. 5, a circuit diagram of a particular illustrative embodiment of a switch detection circuit 508 coupled to an external switch 502 is disclosed and generally designated 500. The external switch 502 includes a capacitor 504 to mitigate the external switch 502 from turning on/off multiple times before the contacts of the external switch 502 achieve a good connection. The capacitor 504 may be from about 1 pF to about 15 pF. The capacitor 504 may consist of 1-5 pF of parasitic capacitance or 1-15 pF of discrete capacitance. The external switch 502 is coupled to a ground 506 to provide a grounded signal to the switch detection circuit 508. The external switch 502 may be a mechanical switch (e.g., a carbon switch, a metal contact switch, and similar devices), an electrical switch (e.g., a field effect transistor, bipolar transistor and similar devices), as well as any other conventional switch or a switch yet to be developed that can provide a signal to the switch detection circuit 508. The external switch 502 may be activated with the removal or insertion of a multimedia card into a multimedia interface (e.g., via a socket switch), removal or insertion of a subscriber identity module (SIM) card into a SIM interface, opening or closing of a clam shell or slide of a wireless telephone, user input via a cellular telephone (e.g., key press or toggle of a button), detection of a hold function for a media player, and the like. The recited list of functions is non-exhaustive and the external switch 502 may be activated for other function of a portable computing device that employs switches.

Further with reference to FIG. 5, the switch detection circuit 508 includes an input node 510 that is coupled to the external switch 502. The input node 510 receives an input signal 512 upon activation of the external switch 502 (e.g., via the closing and the opening of the external switch 502). The switch detection circuit 508 further includes a first current source 514 that provides a first current (e.g., $I_1$) 516 and a second current source 520 that provides a second current (e.g., $I_2$) 522. The first current source 514 and the second current source 520 are pull-up transistors, such as p-channel field effect transistors (PFETs), as illustrative examples. The first current source 514 may be configured to provide a current of about 2 μA and the second current source 520 may be configured to provide a current of about 30 μA. The total current may be about 32 μA (e.g., 2 μA+30 μA). It is noted that the second current source 520 provides a substantially larger current than the first current source 514. In an alternate embodiment the first current source 514 and the second current source 520 may be substituted with a dual mode current source that provides a low current mode and a high current mode, such as the dual mode current source 304 shown in and described above in relation to the switch detection circuit 302 of FIG. 3. The low current mode may provide a current of 2 μA and the high current mode may provide a substantially higher current of 32 μA.

Yet further with reference to FIG. 5, the sources of the first current source 514 and the second current source 520 are coupled to a voltage supply 526, and the drains of the first current source 514 and the second current source 520 are coupled to the input node 510. The voltage source 526 provides a supply voltage, such as about 1.8V, which can be substantially higher or lower in other embodiments. The gate of the first current source 514 is coupled to a ground 518 so that the first current source 514 is always asserted and the gate of the second current source 520 is coupled to a detection circuit 524. In the alternate embodiment in which the first current source 514 and the second current source 520 are substituted with the dual mode current source, the gate of the dual mode current source is coupled to the detection circuit 524. The detection circuit 524 is also coupled to the input node 510. The detection circuit 524 may be a buffer, an inverter, a combination of a comparator and a logic gate, or any other circuit element or combination of circuit elements that can selectively activate the second current source 520 (or the high current mode of the alternate embodiment) as will be described below. An output buffer 528 is coupled to the input node 510. The output buffer 528 provides an output signal 530 to an output node 532 of the switch detection circuit 508. The output buffer 528 exhibits hysteresis and is configured to provide a first output voltage level via output signal 530 (logic low signal) when a voltage at the input node 510 crosses on the way down an output low threshold voltage (Vlow) and a second output voltage level via output signal 530 (logic high signal) when the voltage at the input node 510 crosses on the way up an output high threshold voltage (Vhigh). The output node 532 may be coupled to an input of an integrated circuit 534, such as a processor or a power management circuit as described below in reference to FIGS. 9 and 10.

In operation according to FIG. 5, the external switch 502 provides an input signal 512 to the input node 510. The input signal 512 represents a closing event and an opening event of the external switch 502. The external switch 502 (e.g., a momentary push-button switch, as well as any other mechanical or electrical switch) may be shorted and then released, which applies a zero voltage (e.g., ground 506) to the input node 510. In response to the closing event of the external switch 502 (via grounding) represented by the input signal 512, the voltage at the input node 510 decreases and the buffer 528 outputs a first output voltage level via output signal 530 (logic low signal) to an output node 532 of the switch detection circuit 508 (e.g., decreasing voltage at the input node 510 crosses the output low threshold voltage, Vlow). The output low threshold voltage (Vlow) may be between 0.3 and 0.6 of the voltage supply 526 (e.g., 0.3*1.8=0.54V and 0.6*1.8V=1.08V). That is, the output buffer 528 may be configured to provide the first output voltage level via output signal 530 (logic low signal) at a voltage of 0.3, 0.4, 0.5 or 0.6 of the voltage supply 526 (e.g., 1.8V), as illustrative non-limiting examples. Because the control of the first current source 514 is asserted, the first current source 514 provides a first current (e.g., $I_1$) 516 in response to the voltage drop across the first current source 514 due to the closing event of the external switch 502 represented by the input signal 512 and continues to provide the first current 516 in response to the subsequent opening event of the external switch 502 represented by the input signal 512. In the alternate embodiment, the low current mode of the dual mode current source provides a low current (e.g., 2 μA) in response to a high control voltage level via a control signal from the detection circuit 524. At this point it is assumed that the opening event of the external switch 502 has occurred. As the first current 516 is small (e.g., 2 μA), the voltage at the input node 510 rises slowly in response to the opening event of the external switch 502 represented by the input signal 512.

Further with reference to the operation of FIG. 5, the detection circuit 524 detects when the voltage at the input node 510 is greater than a control threshold voltage (e.g., rising voltage at the node 510 crosses control threshold voltage, Vctrl). The control threshold voltage (Vctrl) may be equivalent to the output low threshold voltage (Vlow) (e.g., both voltage thresholds Vlow and Vctrl may be 0.3 of voltage supply 526). However, control threshold voltage (Vctrl) that is lower than an output low threshold voltage (Vlow) may improve voltage rise time at the input node 510 and may further provide for improved signal timing. For example, the output low threshold voltage (Vlow) may be 0.5*1.8V and the control threshold voltage (Vctrl) may be 0.3*1.8V. Upon detecting the control threshold voltage (Vctrl), the detection circuit 524 selectively activates the second current source 520 and the second current source 520 provides a second current (e.g., $I_2$) 522. In the alternate embodiment, the high current mode of the dual mode current source provides a high current in response to low control voltage level via a control signal from the detection circuit 524. The second current 522 rises more quickly than the first current 516 to about 30 μA. The total current is about 32 μA (e.g., 2 μA+30 μA). In the alternate embodiment, the high current mode of the dual mode current source may provide the 32 μA current. The voltage at the input node 510 likewise rises more quickly as the second current 522 is substantially larger than the first current 516. When the voltage at the input node 510 is greater than an output high threshold voltage (Vhigh), the buffer 528 outputs a second output voltage level via output signal 530 (logic high signal) to the output node 532 of the switch detection circuit 508. The output high threshold voltage (Vhigh) is higher than output low threshold voltage (Vlow) and may be 0.7 of the voltage supply 526 (e.g., 0.7*1.8V=1.26V). That is, the output buffer 528 may be configured to provide the second output voltage level via output signal 530 (logic high signal) at a voltage of 0.7 of the voltage supply 526 (e.g., 1.8V). As described herein, the output node 532 may be connected to an input of an integrated circuit 534, such as a processor or a power management circuit described below in reference to FIGS. 9 and 10.

Figure 6:
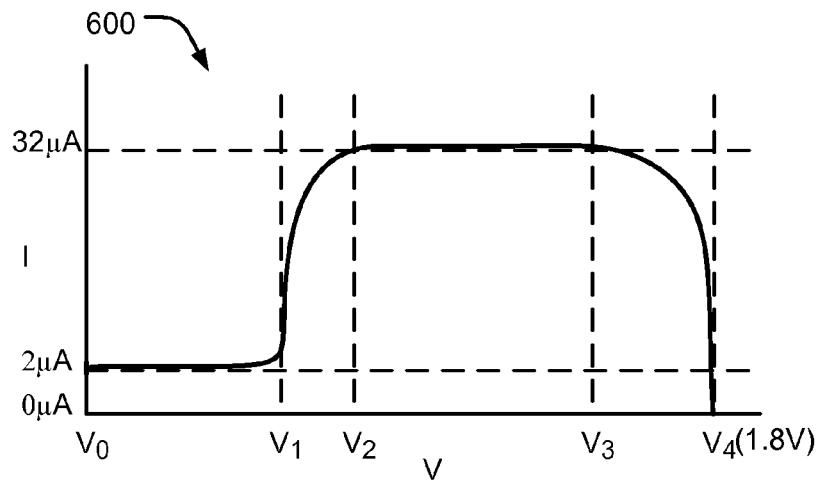
FIG. 6 is an illustrative diagram of a current-voltage characteristic of the switch detection circuit of FIG. 5.

Referring to FIGS. 5 and 6, a particular illustrative embodiment of a current-voltage (I-V) characteristic of the switch detection circuit 508 of FIG. 5 is disclosed and generally designated 600. The I-V characteristic 600 depicts the current (I) versus the voltage (V) that occurs at the input node 510 of the switch detection circuit 508 after the closing event of the external switch 502 represented by the input signal 512 and after the current (I) is in steady state of about 2 µA. More specifically, when the external switch 502 is open, the voltage at the input node 510 is 1.8V as shown at $V_4$. Because there is no differential in voltage between the supply voltage 526 and the voltage at the input node 510 across the first current source 514 and the second current source 520, the first current source 514 and the second current source 520 do not provide current (e.g., current 516 and current 522 are 0 µA). The external switch 502 is shorted and then released, providing the input signal 512 to the input node 510. That is, when the external switch 502 is shorted, the voltage at the input node 510 is driven down to 0V and the first current source 514 provides a first current 516 of about 2 µA, as shown at $V_0$ of the I-V characteristic 600. The first current 516 remains in steady state at about 2 µA, as the voltage remains at $V_0$ (e.g., 0V) until the external switch 502 is opened, and the voltage begins to rise due to charging by the first current source 516 from $V_0$ to an output high threshold voltage $V_1$ (e.g., output high threshold voltage Vhigh). It is noted that the output low threshold voltage threshold (Vlow), which occurs as the voltage at the input node 510 drops, is not represented in this I-V characteristic 600.

Further with reference to FIGS. 5 and 6, the detection circuit 524 detects the control threshold voltage $V_1$ (Vctrl) at the input node 510 and selectively activates the second current source 520. As the second current source 520 is selectively activated in response to the control threshold voltage $V_1$ (Vctrl), the second current 522 rises from about 0 µA, the current charging the input node 510 rises from 2 µA, and the voltage at the node 510 similarly rises from the first threshold voltage $V_1$. As the second current source 520 reaches saturation at about 30 µA, the total current at the input node 510 rises to about 32 µA (e.g., 2 µA+30 µA) and the voltage at the input node 510 rises to about $V_2$. Thereafter, the total current remains in steady state at about 32 µA, as the voltage continues to rise to from about $V_2$ to about an output high threshold voltage $V_3$ (Vhigh). In response to the output high threshold voltage $V_3$ (Vhigh), the output buffer 528 outputs a second output voltage level via output signal 530 (e.g., logic high signal) to the integrated circuit 534 via the output node 532 of the switch detection circuit 508 (e.g., increasing voltage crosses Vhigh). Thereafter, as the voltage increases from the output high threshold voltage $V_3$ to voltage $V_4$, the differential in voltage between the supply voltage 526 and the voltage at the input node 510 across the first current source 514 and the second current source 520 decreases to zero, and the currents 516, 522 roll off to about 0 µA (e.g., current sources 514 and 520 cease to provide respective currents 516 and 522).

Figure 7:
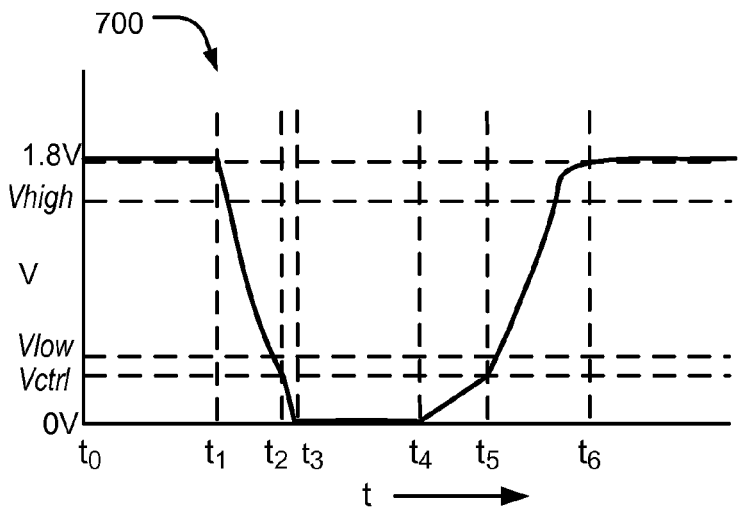
FIG. 7 is an illustrative diagram of a voltage-time characteristic of the switch detection circuit of FIG. 5.

Referring to FIGS. 5 and 7, a particular illustrative diagram of a voltage-time characteristic of the switch detection circuit 508 of FIG. 5 is disclosed and generally designated 700. When the external switch 502 is open at time to, the voltage at the input node 510 is approximately equal to the voltage supply 526, illustrated as 1.8V in the voltage-time characteristic 700 of FIG. 7. The external switch 502 is shorted (e.g., closed) at about time $t_1$ and the voltage is sharply driven down from about 1.8V to about 0V at about time $t_3$. At the output low threshold voltage Vlow (e.g., as falling voltage at input node 510 crosses Vlow), the output buffer 528 outputs a first output voltage level via output signal 530 (logic low signal) to the output node 532. At the output high threshold voltage Vhigh (e.g., as decreasing voltage at input node 510 crosses Vhigh), the detection circuit 524 turns the second current source 520 off. The voltage remains at about 0V while the external switch 502 remains shorted between time $t_3$ and time $t_4$. At time $t_4$, the external switch 502 is released (e.g., opened). Between time $t_4$ and time $t_5$, the first current source 514 raises the voltage at the input node 510 to the control threshold voltage Vctrl. The detection circuit 524 detects the control threshold voltage Vhigh at time $t_5$ and activates the second current source 520. Between time $t_5$ and time $t_6$, the second current source 520 sharply raises the voltage at the input node 510 to reach the output high threshold voltage Vhigh. The voltage rise between $t_5$ and $t_6$ (e.g., after the second current source 520 is selectively activated) is substantially sharper than the voltage rise between $t_4$ and $t_5$ (e.g., when only the first current source 514 provides a small current). At the output high threshold voltage Vhigh (e.g., as rising voltage at input node 510 crosses Vhigh), the output buffer 528 outputs a second output voltage level via output signal 530 (logic high signal) to the output node 532. As the voltage increases between time $t_5$ and time $t_6$, where there is no differential in voltage between the supply voltage 526 and the voltage at the input node 510 across the first current source 514 and the second current source 520, the current sources 514 and 520 cease to provide respective currents 516 and 522 that raise the voltage at the node 510. Consequently, the voltage at the node 510 plateaus to a steady state of about 1.8V at about time $t_6$.

Figure 8:
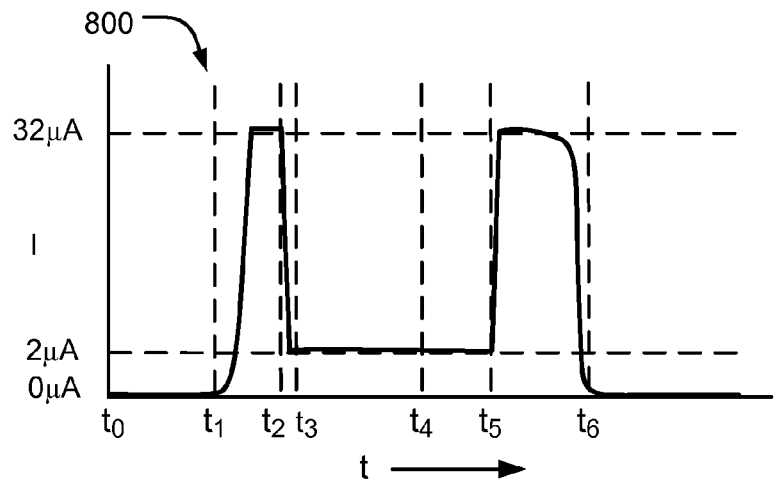
FIG. 8 is an illustrative diagram of a current-time characteristic of the switch detection circuit of FIG. 5.

Referring to FIGS. 5, 7 and 8, a particular illustrative diagram of a current-time characteristic of the switch detection circuit 508 of FIG. 3 is disclosed and generally designated 800. At time $t_0$, the external switch 502 is open, the input node 510 is at the voltage supply 526, and the first current source 514 and the second current source 520 are in steady state. More specifically, because there is no differential in voltage between the supply voltage 526 and the voltage at the input node 510 across the first current source 514 and the second current source 520, the first current source 514 and the second current source 520 do not provide current (e.g., first current 516 and second current 522 are 0 µA). At time $t_1$, as the external switch 502 is shorted (e.g., closed) and the voltage at the input node 510 begins to decrease from 1.8V to 0V, the first current source 514 begins to provide the first current 516 and the second current source 520 begins to provide the second current 522, bringing the total current at the input node 510 to 32 µA. However, the switch 502 discharges the input node 510 faster than the first current source 514 and the second current source 520 can charge the input node 510, and the voltage continues to decrease at the input node 510. At time $t_2$, as the voltage at the node 510 falls below the output high threshold voltage Vhigh, the detection circuit 524 turns the second current source 520 off. The current at the node 510 falls sharply to 2 µA, as only the first current source 514 provides the first current 516. Between time $t_3$ and time $t_4$, the external switch 502 remains closed and the first current source 514 continues to provide the first current 516 (e.g., 2 µA).

Further with reference to FIGS. 5, 7 and 8, at time $t_4$ the external switch 502 is released (opened) and the voltage at the node 510 rises slowly because only the first current source 514 is providing a small first current 516 (e.g., 2 μA). At time $t_5$, as the voltage at the input node 510 rises above the control threshold voltage Vctrl, the detection circuit 524 detects that the voltage at the input node 510 has crossed above the control threshold voltage Vctrl and selectively activates the second current source 520, which provides the substantially larger second current 522 (e.g., 30 μA) and accelerates the rise time of the voltage at the input node 510. The current at the input node 510 rises sharply to about 32 μA (e.g., 2 μA+30 μA). Between time $t_5$ and $t_6$, as the voltage at the input node 510 increases to 1.8V, where there is again no differential in voltage between the supply voltage 526 and the voltage at the input node 510 across the first current source 514 and the second current source 520, the currents 516, 522 roll off to about 0 μA (e.g., current sources 514 and 520 cease to provide respective currents 516 and 522).

Figure 9:
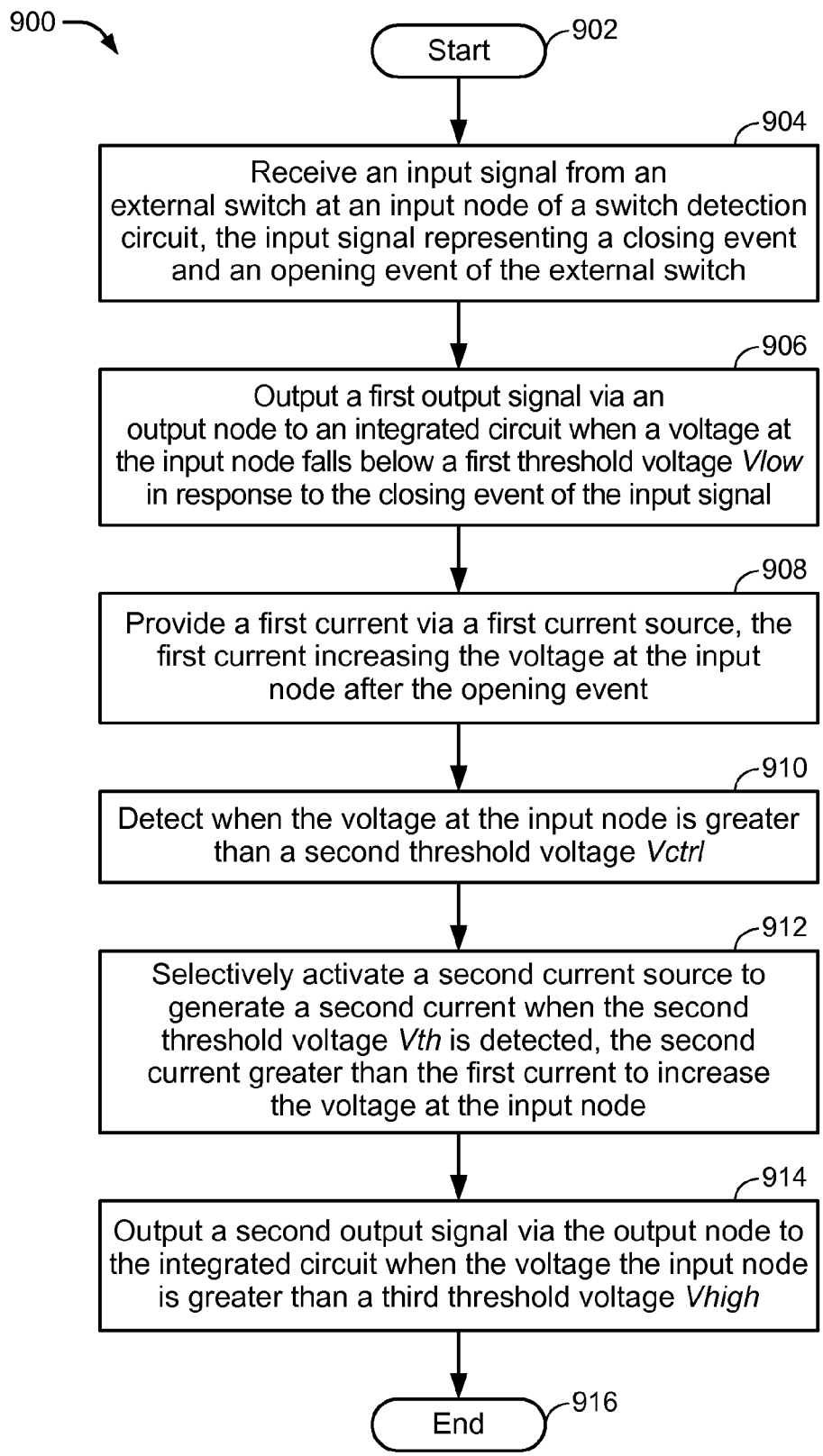
FIG. 9 is a flow diagram of a particular illustrative embodiment of a method of operating a switch detection circuit, such as the switch detection circuit of FIG. 5.

Referring to FIG. 9, a flow diagram of a particular illustrative method of operating a switch detection circuit, such as switch detection circuit 508 of FIG. 5, is disclosed and generally designated 900. The method 900 begins at 902. At this point, a certain event or function may have occurred, such as a user opening or closing the clamshell or slide of a cellular telephone, inserting or removing a multimedia card into a cellular telephone media socket, causing an external switch 502 associated with that function to provide a grounded input signal 512. At 904, the input signal 512 is received from the external switch 502 at an input node 510 of a switch detection circuit 508. The input signal represents a closing event and an opening event of the external switch 502. At 906, an output buffer 528 outputs a first output voltage level via output signal 530 (logic low signal) to the integrated circuit 534 via the output node 532. The first output voltage level via output signal 530 is output when the voltage at the input node 510 falls below an output low threshold voltage Vlow in response to the closing event of the external switch 502 represented by the input signal 512. At 908, a first current source 514 provides a first current 516 in response to the closing event of the external switch 502 represented by input signal 512. After the opening event of the external switch 502, first current 516 increases the voltage at the input node 510. At 910, a detection circuit 524 detects when the voltage at the input node 510 is greater than about a control threshold voltage Vctrl. At 912, a second current source 520 is selectively activated to generate a second current 522 when the control threshold voltage Vctrl is detected, the second current 522 being greater than the first current 516 to increase the voltage at the input node 510. At 914, the output buffer 528 outputs a second output voltage level via output signal 530 (logic high signal) to the integrated circuit 534 via the output node 532. The second output voltage level via second output signal 530 is output when the voltage at the input node 510 rises above an output high threshold voltage Vhigh. Thereafter, the method ends at 916. It is to be noted that one skilled in the art may easily modify the method disclosed in FIG. 9 to accommodate the alternate embodiment that employs a dual mode current source to accomplish similar outputs as depicted in FIG. 9.

Figure 10:
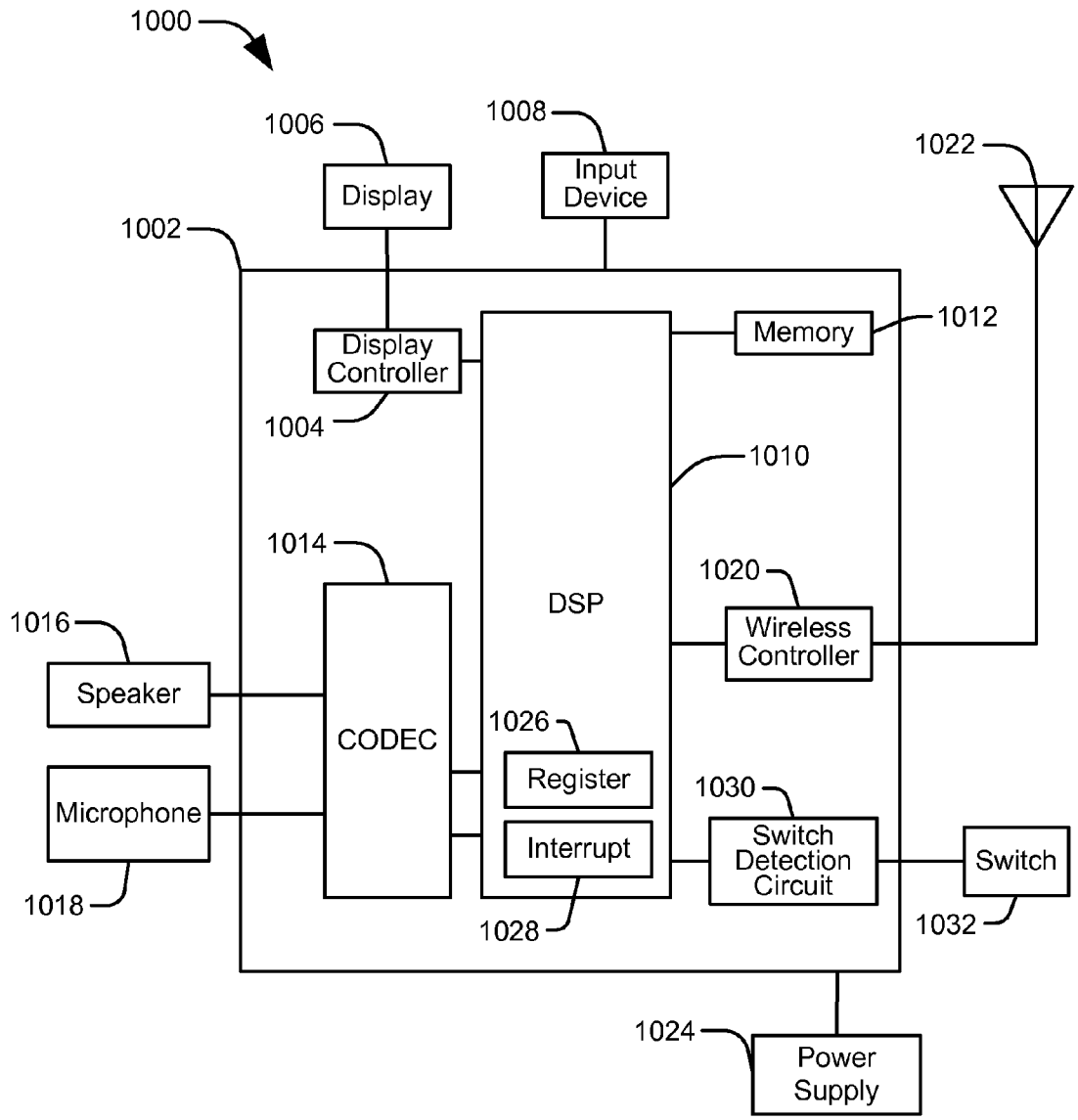
FIG. 10 is a block diagram of a particular illustrative embodiment of a portable electronic device including the dual current source switch detection circuit of FIGS. 1-5.

Referring to FIG. 10, a block diagram of a particular illustrative embodiment of an electronic device including the external switch 1032 and a switch detection circuit 1030, is depicted and generally designated 1000. In this embodiment, the electronic device 1000 is a portable electronic device, such as wireless telephone. The electronic device 1000 includes a processor, such as a digital signal processor (DSP) 1010 that is coupled to the switch detection circuit 1030, which in turn is coupled to the external switch 1032. In a particular embodiment, the switch detection circuit 1030 may be the switch detection circuit 108 of FIG. 1, the switch detection circuit 208 of FIG. 2, the switch detection circuit 302 of FIG. 3, the switch detection circuit 402 of FIG. 4, the switch detection circuit 508 of FIG. 5, or the switch detection circuit 1030 may operate in accordance with any of the FIGS. 6-8, or any combination thereof. The external switch 1032 may be the external switch 102 of FIGS. 1 and 3, the external switch of 202 of FIGS. 2 and 4, the external switch 502 of FIG. 5, as well as any other conventional switch or a switch yet to be developed that can provide a signal to the respective switch detection circuit of the foregoing FIGS. 1-5. The DSP 1010 may be a circuit that has a power mode (e.g., a low power mode) and may include a firmware or a software power management module (not shown) that manages the power mode of the DSP 1010. The DSP 1010 can include a register 1026 that can be set by the switch detection circuit 1030. The DSP 1010 can also include an interrupt 1028 that can be driven by the switch detection circuit 1030. The firmware or software power management module may receive the interrupt 1028 to exit the power mode and that may access the register 1026 to determine which external switch (e.g., external switch 1032) has caused the interrupt 1028. In this illustrative example, the external switch 1032 and the switch detection circuit 1030 characteristics as well as their operation have been described above in reference to FIGS. 1-9.

FIG. 10 further shows a memory 1012 coupled to the digital signal processor (DSP) 1010. A display controller 1004 is coupled to the digital signal processor 1010 and to a display 1006. A coder/decoder (CODEC) 1014 can also be coupled to the digital signal processor 1010. A speaker 1016 and a microphone 1018 can be coupled to the CODEC 1014.

FIG. 10 also indicates that a wireless controller 1020 can be coupled to the digital signal processor 1010 and to a wireless antenna 1022. In a particular embodiment, the DSP 1010, the display controller 1004, the memory 1012, the CODEC 1014, the wireless controller 1020, and the switch detection circuit 1030 are included in a system-in-package or system-on-chip device 1002. In a particular embodiment, an input device 1008, a power supply 1024, and a external switch 1032 are coupled to the system-on-chip device 1002. Moreover, in a particular embodiment, as illustrated in FIG. 10, the display 1006, the input device 1008, the speaker 1016, the microphone 1018, the wireless antenna 1022, the power supply 1024, and the external switch 1032 are external to the system-on-chip device 1002. However, each of the display 1006, the input device 1008, the speaker 1016, the microphone 1018, the wireless antenna 1022, the power supply 1024, and the external switch 1032 can be coupled to a component of the system-on-chip device 1002, such as an interface or a controller.

Figure 11:
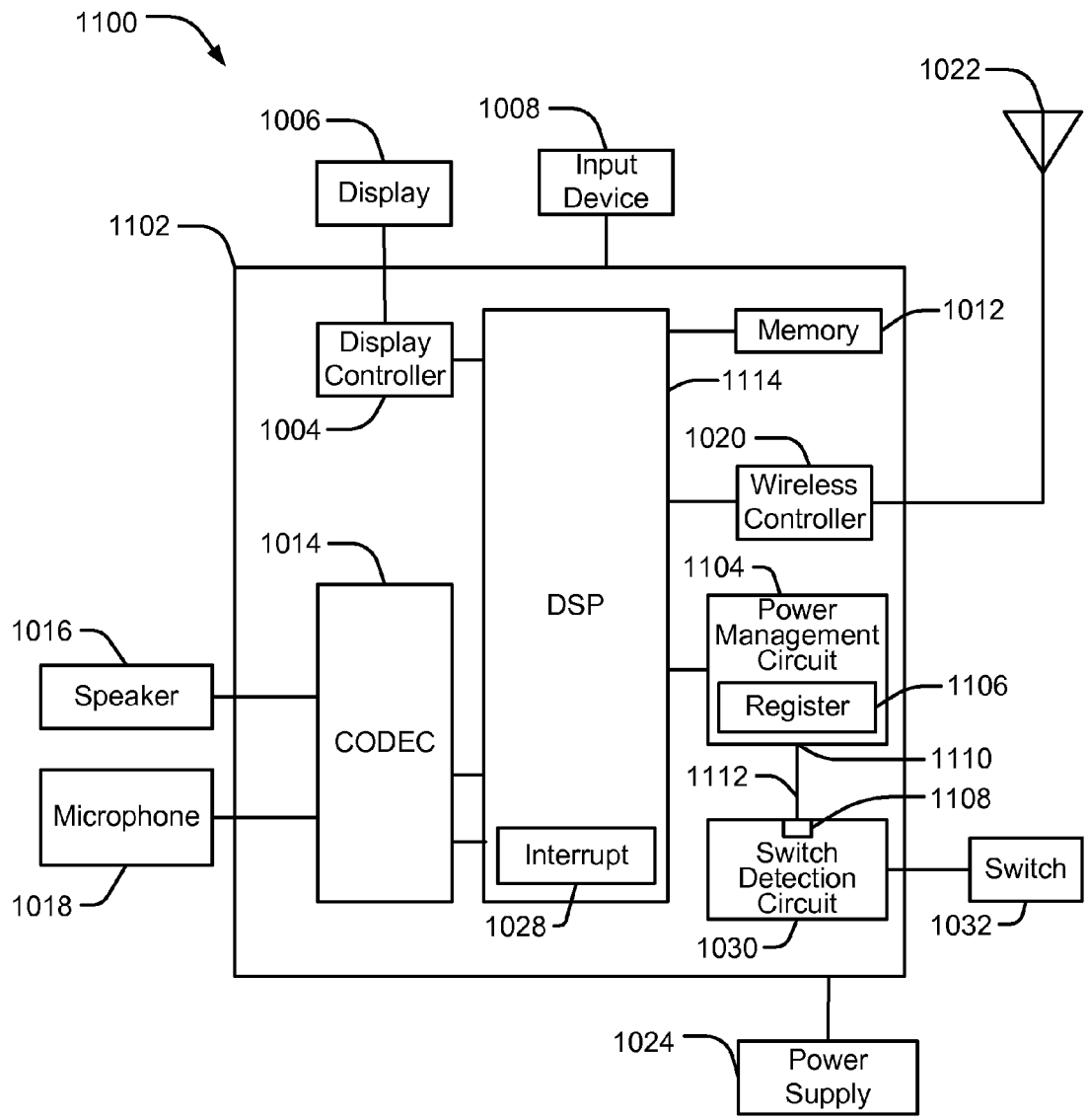
FIG. 11 is a block diagram of another particular illustrative embodiment of a portable electronic device including the dual current source switch detection circuit of FIGS. 1-5.

Referring to FIG. 11, a block diagram of a particular illustrative embodiment of an electronic device including the external switch 1032 and the switch detection circuit 1030, is depicted and generally designated 1100. The electronic device 1100 and its operation are similar to the electronic device 1000 of FIG. 10 described above. A DSP 1114 has a power mode (e.g., a low power mode) and includes an interrupt 1028. Furthermore, the electronic device 1100 includes a power management circuit or controller 1104 that is coupled to the DSP 1114 and that manages the power mode of the DSP 1114. A power management circuit or controller 1104 includes an input 1110 coupled to the output node 1108 (e.g., output node 128, 228, 532 of FIGS. 1-5) of the switch detection circuit 1030 (e.g., switch detection circuit 108, 208, 302, 402 and 508 of FIGS. 1-5). The power management circuit or controller 1104 is configured to manage the power mode of the DSP 1114 based on the output signal 1112 (e.g., output signal 126, 226, 530 of FIGS. 1-5) provided by the switch detection circuit 1030 (e.g., switch detection circuit 108, 208, 302, 402 and 508 of FIGS. 1-5) via output node 1108 (e.g., output node 128, 228, 532 of FIGS. 1-5), as illustratively described above in reference to FIGS. 1-9. The power management circuit 1104 may include a register 1106 that can be set by the switch detection circuit 1030. The register 1106 provides information as to the particular external switch (e.g., external switch 1032) associated with the output signal 1112. In response to the output signal 1112 from the switch detection circuit 1030, the power management circuit 1104 may control the power mode of the DSP 1114 by driving the interrupt 1028 in the DSP 1114. In turn, the DSP 1114 may read the register 1106 of the power management circuit 1104 to determine what external switch (e.g., external switch 1032) has caused the interrupt 1028 in the DSP 1114. In an alternate embodiment, the switch detection circuit 1030 can be included in or integrated on the power management circuit or controller 1104. In yet another embodiment, the power management circuit 1104 can be integrated on the system-in-package or the system-on-chip 1102.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor-executed software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An electronic device comprising:
    a switch; and
    a switch detection circuit comprising:
        an input node coupled to the switch;
        a first current source coupled to the input node;
        a second current source coupled to the input node, wherein the second current source is coupled to the first current source in parallel; and
        a detection circuit having an input coupled to the input node, the detection circuit providing an output coupled to the second current source to selectively activate the second current source when a voltage at the input node exceeds a control threshold voltage.

2. The electronic device of claim 1, wherein the switch detection circuit further comprises:
    an output buffer coupled to the input node, the output buffer to provide an output signal; and
    an output node coupled to the output buffer.

3. The electronic device of claim 2, further comprising a processor having an interrupt driven by the output signal of the switch detection circuit and a register that is set based on the output signal of the switch detection circuit.

4. The electronic device of claim 2, further comprising:
    a circuit having a power mode; and
    a power management circuit having an input coupled to the output node of the switch detection circuit, the power management circuit configured to manage the power mode of the circuit based on the output signal from the switch detection circuit.

5. The electronic device of claim 4, wherein the power management circuit includes a register that is set based on the output signal of the switch detection circuit.

6. The electronic device of claim 4, wherein the circuit includes an interrupt driven by the power management circuit based on the output signal from the switch detection circuit.

7. The electronic device of claim 4, wherein the power management circuit includes the switch detection circuit.

8. The electronic device of claim 1, wherein the switch is a mechanical switch or an electrical switch.

9. The electronic device of claim 1, wherein the switch is associated with a function selected from the group consisting of detection of multimedia card removal or insertion, detection of a subscriber identity module (SIM) card insertion or removal, detection of mobile station clamshell or slide being open or closed, detection of a user input, and detection of a hold related to a multimedia play list function.

10. A switch detection circuit comprising:
    an input node to receive an input signal from a switch;
    a first current source coupled to the input node;
    a second current source coupled to the input node, wherein the second current source is coupled to the first current source in parallel; and
    a detection circuit having an input coupled to the input node, the detection circuit providing an output coupled to the second current source to selectively activate the second current source when a voltage at the input node exceeds a control threshold voltage.

11. The switch detection circuit of claim 10, wherein the detection circuit is selected front the group consisting of a buffer, an inverter, and a combination of a comparator and a logic gate.

12. The switch detection circuit of claim 10, wherein the first current source provides a first current of about 2 microamps ($\mu A$) and the second current source provides a second current of about 30 $\mu A$.

13. The switch detection circuit of claim 10, wherein the first current source and the second current source comprise a first pull-up transistor and a second pull-up transistor, respectively.

14. The switch detection circuit of claim 10, wherein the first current source and the second current source comprise a first pull-down transistor and a second pull-down transistor, respectively.

15. The switch detection circuit of claim 10, wherein a second current provided by the second current source is substantially higher than a first current provided by the first current source.

16. A method comprising:
providing a first current via a first current source, the first current to increase a voltage at an input node of a switch detection circuit after an opening event associated with an input signal;
detecting when the voltage is greater than a control threshold voltage;
selectively activating a second current source to generate a second current when the voltage exceeds the control threshold voltage, the second current to increase the voltage at the input node, the second current being greater than the first current; and
outputting an output signal at a first level when the voltage at the input node is greater than an output high threshold voltage.

17. The method of claim 16, further comprising outputting the output signal at a second level when the voltage at the input node is lower than an output low threshold voltage.

18. The method of claim 16, further comprising receiving the input signal from a switch at the input node of the switch detection circuit.

19. The method of claim 16, further comprising driving an interrupt of a processor via the output signal.

20. The method of claim 16, further comprising setting a register of a processor based on the output signal.

21. The method of claim 16, further comprising setting a register of a power management circuit based on the output signal.

22. An electronic device comprising:
a switch detection circuit comprising:
an input node coupled to a switch;
a dual mode current source coupled to the input node, the dual mode current source including a low current mode to provide a first current coupled to a first current source, and a high current mode to provide a second current coupled to a second current source, wherein the second current source is coupled to the first current source in parallel; and
a detection circuit having an input coupled to the input node, the detection circuit providing an output coupled to the dual mode current source to selectively activate at least the high current mode when a voltage at the input node exceeds a control threshold voltage.

23. The electronic device of claim 22, wherein the dual mode current source comprises a pull-up transistor or a pull-down transistor.

24. A switch detection circuit comprising:
an input node to receive an input signal from a switch;
a dual mode current source coupled to the input node, the dual mode current source including a low current mode to provide a first current coupled to a first current source, and a high current mode to provide a second current coupled to a second current source, wherein the second current source is coupled to the first current source in parallel; and
a detection circuit having an input coupled to the input node, the detection circuit providing an output coupled to the dual mode current source to selectively activate at least the high current mode when a voltage at the input node exceeds a control threshold voltage.

25. The switch detection circuit of claim 24, wherein the first current is about 2 microamps (μA) and the second current is about 32 μA.

* * * * *